(12) United States Patent
Odnoblyudov et al.

(10) Patent No.: US 9,705,038 B2
(45) Date of Patent: Jul. 11, 2017

(54) ENGINEERED SUBSTRATE ASSEMBLIES WITH EPITAXIAL TEMPLATES AND RELATED SYSTEMS, METHODS, AND DEVICES

(71) Applicant: Quora Technology, Inc., Los Gatos, CA (US)

(72) Inventors: Vladimir Odnoblyudov, Eagle, ID (US); Martin F. Schubert, Boise, ID (US)

(73) Assignee: Quora Technology, Inc., Santa Clara, CA (US)

( * ) Notice: Subject to any disclaimer, the term of this patent is extended or adjusted under 35 U.S.C. 154(b) by 0 days.

(21) Appl. No.: 14/797,911

(22) Filed: Jul. 13, 2015

(65) Prior Publication Data

US 2016/0020360 A1    Jan. 21, 2016

Related U.S. Application Data

(62) Division of application No. 13/732,739, filed on Jan. 2, 2013, now Pat. No. 9,082,692.

(51) Int. Cl.
*H01L 33/32* (2010.01)
*H01L 33/00* (2010.01)
(Continued)

(52) U.S. Cl.
CPC .......... *H01L 33/32* (2013.01); *H01L 21/6835* (2013.01); *H01L 21/76254* (2013.01);
(Continued)

(58) Field of Classification Search
None
See application file for complete search history.

(56) References Cited

U.S. PATENT DOCUMENTS

| 5,811,348 A | 9/1998 | Matsushita et al. |
| 2003/0143772 A1 | 7/2003 | Chen |

(Continued)

FOREIGN PATENT DOCUMENTS

| JP | 2008001540 | 1/2008 |
| JP | 2008177563 | 7/2008 |

OTHER PUBLICATIONS

International Search Report and Written Opinion issued Apr. 28, 2014 in International Application No. PCT/US2013/078512, 13 pages.
(Continued)

*Primary Examiner* — Khaja Ahmad
(74) *Attorney, Agent, or Firm* — Kilpatrick Townsend & Stockton LLP

(57) ABSTRACT

Engineered substrates having epitaxial templates for forming epitaxial semiconductor materials and associated systems and methods are disclosed herein. In several embodiments, for example, an engineered substrate can be manufactured by forming a first semiconductor material at a front surface of a donor substrate. The first semiconductor material is transferred to first handle substrate to define a first formation structure. A second formation structure is formed to further include a second semiconductor material homoepitaxial to the first formation structure. The method can further include transferring the first portion of the second formation structure to a second handle substrate such that a second portion of the second formation structure remains at the first handle substrate.

10 Claims, 9 Drawing Sheets

(51) Int. Cl.
*H01L 33/06* (2010.01)
*H01L 33/24* (2010.01)
*H01L 29/205* (2006.01)
*H01L 21/762* (2006.01)
*H01L 21/683* (2006.01)
*H01L 29/20* (2006.01)

(52) U.S. Cl.
CPC ........ H01L 29/205 (2013.01); H01L 33/0079 (2013.01); H01L 33/24 (2013.01); *H01L 29/2003* (2013.01); *H01L 33/06* (2013.01); *H01L 2221/6835* (2013.01); *H01L 2221/68368* (2013.01); *H01L 2221/68381* (2013.01)

(56) References Cited

U.S. PATENT DOCUMENTS

| | | | |
|---|---|---|---|
| 2004/0135166 A1 | 7/2004 | Yamada et al. | |
| 2004/0214434 A1 | 10/2004 | Atwater et al. | |
| 2005/0101105 A1 | 5/2005 | Ghyselen et al. | |
| 2006/0255341 A1 | 11/2006 | Pinnington et al. | |
| 2006/0286771 A1 | 12/2006 | Shaheen et al. | |
| 2007/0216042 A1 | 9/2007 | Delprat et al. | |
| 2007/0284660 A1 | 12/2007 | Deguet et al. | |
| 2008/0111144 A1* | 5/2008 | Fichtenbaum | B82Y 20/00 257/96 |
| 2008/0142812 A1 | 6/2008 | Chang et al. | |
| 2008/0303033 A1 | 12/2008 | Brandes | |
| 2009/0035885 A1* | 2/2009 | Karlicek, Jr. | H01L 21/76254 438/45 |
| 2009/0179207 A1 | 7/2009 | Chitnis et al. | |
| 2009/0221131 A1* | 9/2009 | Kubota | C30B 19/12 438/478 |
| 2010/0200864 A1 | 8/2010 | Bader et al. | |
| 2010/0301347 A1* | 12/2010 | Chung | H01L 21/2007 257/76 |
| 2011/0147772 A1* | 6/2011 | Lochtefeld | C30B 29/06 257/94 |
| 2012/0205661 A1 | 8/2012 | Kyono et al. | |
| 2012/0228672 A1 | 9/2012 | Daval et al. | |
| 2012/0322186 A1 | 12/2012 | Rode et al. | |
| 2014/0183442 A1 | 7/2014 | Odnoblyudov et al. | |
| 2014/0335676 A1 | 11/2014 | Berger et al. | |

OTHER PUBLICATIONS

Notice of Allowance dated Mar. 6, 2015 for U.S. Appl. No. 13/732,739, filed Jan. 2, 2013, 8 pages.
Non-final Office Action dated Jul. 18, 2014 for U.S. Appl. No. 13/723,739, filed Jan. 2, 2013, 15 pages.
European Search Report dated Jul. 25, 2016 for 13869928.5, 7 pages.
IPRP dated Jul. 16, 2015 for PCT/US2013/078512 filed Dec. 31, 2013, 10 pages.

* cited by examiner

ENGINEERED SUBSTRATE ASSEMBLIES WITH EPITAXIAL TEMPLATES AND RELATED SYSTEMS, METHODS, AND DEVICES

CROSS-REFERENCE TO RELATED APPLICATION(S)

This application is a divisional of U.S. patent application Ser. No. 13/732,739, filed Jan. 2, 2013, now U.S. Pat. No. 9,082,692, which is incorporated herein by reference in its entirety.

TECHNICAL FIELD

The present technology relates to engineered substrate assemblies having epitaxial templates for forming epitaxial semiconductor materials.

BACKGROUND

Mobile phones, personal digital assistants ("PDAs"), digital cameras, MP3 players, and other portable electronic devices utilize light-emitting diodes ("LEDs"), organic light-emitting diodes ("OLEDs"), polymer light-emitting diodes ("PLEDs"), and other solid-state transducer ("SST") devices for, e.g., backlighting. SST devices are also used for signage, indoor lighting, outdoor lighting, and other types of general illumination. FIG. 1A is a cross-sectional view of a conventional SST device 10a with lateral contacts. As shown in FIG. 1A, the SST device 10a includes a substrate 20 carrying an LED structure 11 having an active region 14, e.g., containing gallium nitride/indium gallium nitride (GaN/InGaN) multiple quantum wells ("MQWs") between N-type GaN 15 and P-type GaN 16. The SST device 10a also includes a first contact 17 on a forward-facing surface of the P-type GaN 16 and a second contact 19 spaced laterally apart from the first contact 17 on a forward-facing surface of the N-type GaN 15. The first contact 17 typically includes a transparent and conductive material (e.g., indium tin oxide ("ITO")) through which light is emitted from the LED structure 11. FIG. 1B is a cross-sectional view of another conventional SST device 10b in which the first and second contacts 17 and 19 are at opposite sides of the LED structure 11 in a vertical configuration rather than a lateral configuration. In the SST device 10b, the first contact 17 typically includes a reflective and conductive material (e.g., aluminum) to direct light toward the N-type GaN 15.

One difficulty of forming SST devices is that manufacturing the various semiconductor materials can be expensive and time consuming. For example, GaN materials (e.g., the N-type GaN 15 or the P-type GaN 16) can be formed by a heteroepitaxial growth process that involves depositing GaN on a semiconductor carrier substrate having a different lattice structure (or lattice constant) than the deposited GaN. The lattice mismatch between the GaN and the carrier substrate can create defects, dislocations, and strain that can negatively impact SST device performance. Also, the GaN and the carrier substrate can have different coefficients of thermal expansion (CTE). Consequently, thermal processing can delaminate the GaN or bow the carrier substrate carrying the GaN.

DETAILED DESCRIPTION

Specific details of several embodiments for making engineered substrates and formation structure templates are described below. The term "homoepitaxial" generally refers to adjacent semiconductor materials (e.g., in a stack of materials) that have the same or substantially similar materials, lattice structures, and lattice constants. The terms "homoepitaxy" or "homoepitaxially" can refer to formation techniques, including epitaxial growth techniques, for forming homoepitaxial semiconductor materials. The term "heteroepitaxial" generally refers to adjacent semiconductor materials that have dissimilar material, lattice structures, and/or lattice constants. The terms "heteroepitaxy" or "heteroepitaxially" can refer to formation techniques, including epitaxial growth techniques, for forming heteroepitaxial semiconductor materials. The term "substrate" can refer to a support for semiconductor materials, formation structures, and/or individual SST structures or devices. The term "substrate" can also refer to larger wafers that can support such materials, structures, or devices or a plurality of such materials, structures, or devices. The term "SST" generally refers to solid-state transducers that include a semiconductor material as the active medium to convert electrical energy into electromagnetic radiation in the visible, ultraviolet, infrared, and/or other spectra. For example, SSTs include solid-state light emitters (e.g., LEDs, laser diodes, etc.) and/or other sources of emission other than electrical filaments, plasmas, or gases. SSTs can also include solid-state devices that convert electromagnetic radiation into electricity. A person skilled in the relevant art will also understand that the technology may have additional embodiments, and that the technology may be practiced without several of the details of the embodiments described below with reference to FIGS. 1A-5.

FIGS. 2A-2F are cross-sectional views illustrating a method of forming engineered substrate assembles in accordance with selected embodiments of the present technology. An engineered substrate assembly can include a formation structure that includes a first semiconductor material and a second semiconductor material homoepitaxial to the first semiconductor material. In some embodiments, the engineered substrate assembly provides the formation structure as a template such that one or more portions of the formation structure can be readily transferred to other substrates to seed or form other formation structures. In some embodiments, an SST device is manufactured to include the formation structure and optionally the engineered substrate assembly.

Figure 1A:
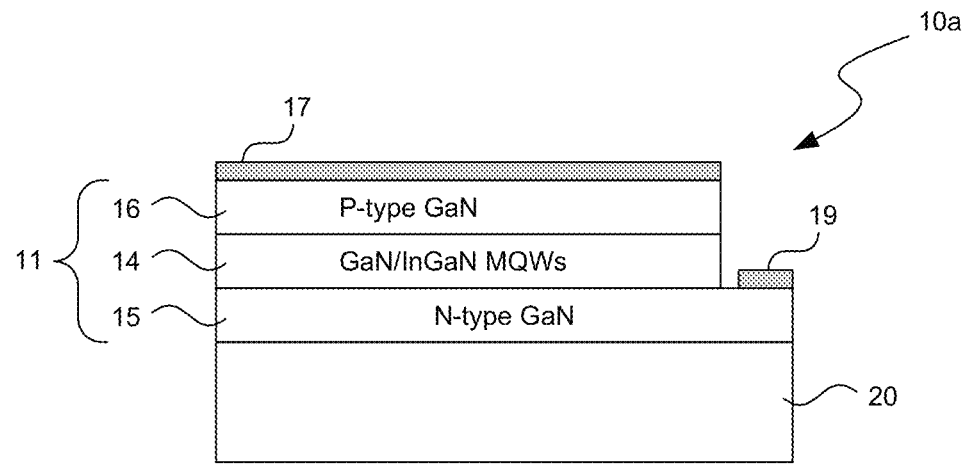
FIG. 1A is a partially schematic cross-sectional diagram of an SST device in accordance with the prior art.
Figure 1B:
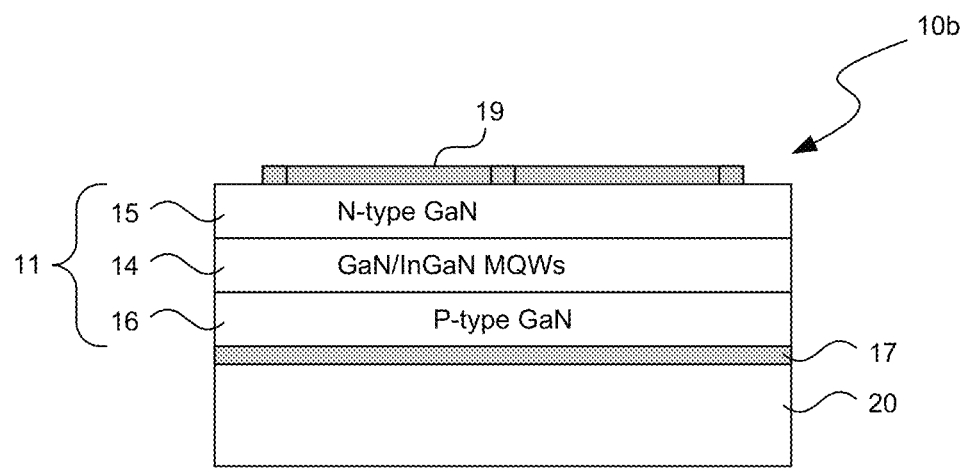
FIG. 1B is a partially schematic cross-sectional diagram of an SST device configured in accordance with the prior art.
Figure 2A:
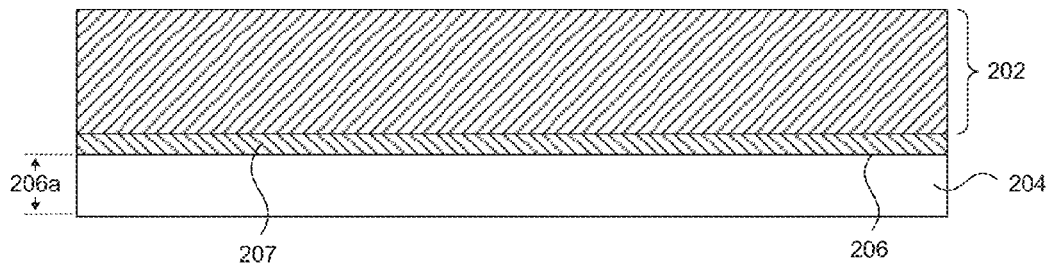
FIGS. 2A-2F are cross-sectional views illustrating a method of forming an engineered substrate assembly in accordance with the present technology.

FIG. 2A is a cross-sectional view of a donor substrate 202 during a manufacturing stage in which a semiconductor material 204 is formed at a front-side surface 206 of the donor substrate 202. The semiconductor material 204 is heteropitaxial to the donor substrate 202 and can be formed, for example, using physical vapor deposition ("PVD"), chemical vapor deposition ("CVD"), atomic layer deposition ("ALD"), and/or other formation methods known in the art. In one embodiment, the semiconductor material 204 can include a III-V semiconductor material having a Wurtzite crystal structure, such as GaN, and the donor substrate 202 can include a substrate material having a cubic crystal structure, such as silicon (Si).

The semiconductor material 204 extends to a front-side thickness level 206a. In one embodiment, the front-side thickness level 206a can be in the range of from about 0.1 μm to about 10 μm. In other embodiments, the thickness is limited due to the difference in CTEs between the semiconductor material 204 and the substrate material of the donor substrate 202. In particular, the likelihood that thermal processing will cause delamination of the semiconductor material 204 and/or warping of the donor substrate 202 increases as the thickness of the semiconductor material increases. Also, the thickness of the semiconductor material 204 can be limited by the size of the donor substrate 202. For example, the thermal mass of large donor substrates (e.g., 150 mm, 200 mm, or 300 mm diameter wafers) can more readily cause delamination or warping of semiconductor materials than smaller donor substrates (e.g., 100 mm or 75 mm diameter wafers).

The donor substrate 202 includes materials that facilitate epitaxial growth of the semiconductor material 204. For example, the donor substrate 202 can facilitate the growth of III-V nitride materials (e.g., for an LED structure). The donor substrate 202 can include Si, and at least a portion of the Si can have a (1,1,1) crystal orientation. In other embodiments, the donor substrate 202 can have a different crystal orientation and/or different materials, such as Si(1,0,0), GaN, SiC, $Al_2O_3$, zinc oxide ($ZnO_2$), gallium arsenide (GaAs), a combination of the foregoing materials, and/or other suitable materials that facilitate epitaxial growth.

The donor substrate 202 and the semiconductor material 204 can be engineered to have a specific lattice structure or crystal orientation. For example, the semiconductor material 204 can have a lattice constant that is modified through straining or alloying the materials of the donor substrate 202. In certain embodiments, the donor substrate 202 and/or semiconductor material 204 can have non-standard or unconventional crystal orientations. For example, the front-side surface 206 of the donor substrate 202 can provide a crystal face in a plane other than the (1,1,1), (1,1,0), or (1,0,0) crystal planes (i.e., when the donor substrate 202 has a cubic lattice).

In some embodiments, the donor substrate 202 can include an optional intermediary material 207. The intermediary material 207 can include, for example, another epitaxial semiconductor material that provides a lattice transition between the semiconductor material 204 and the bulk of the donor substrate 202. In general, the intermediary material 207 can facilitate epitaxial growth and prevent the amalgamation of materials during thermal processing. For example, an aluminum gallium nitride (AlGaN) intermediary material can prevent the amalgamation of Si and GaN. In other embodiments, however, the interface material can be omitted.

Figure 2B:
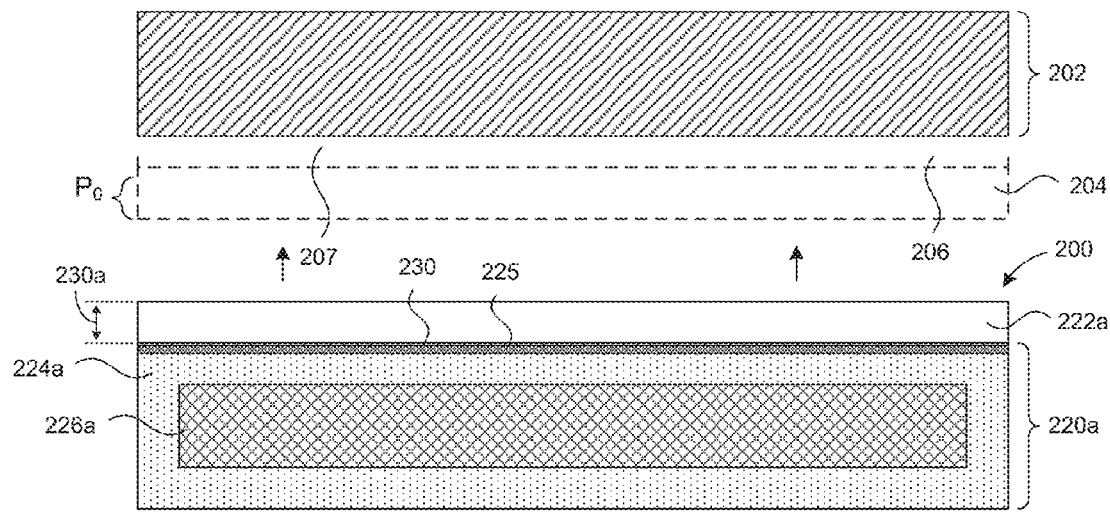

FIG. 2B is a cross-sectional view of an engineered substrate assembly 200 during a manufacturing stage in which a seed portion ("$P_0$") of the semiconductor material 204 is transferred from the semiconductor material 204 on the donor substrate 202 to a first handle substrate 220a to form a first formation structure 222a on the first handle substrate 220a. The first handle substrate 220a includes a first bonding material 224a (e.g., an oxide or nitride material) and a first substrate material 226a. The first substrate material 226a can include, for example, ceramic, glass, or other suitable materials. In one embodiment, the first substrate material 226a can include poly-aluminum nitride (p-AlN), which has a CTE that is similar to the CTE of GaN.

The first bonding material 224a can be formed using PVD, CVD, ALD, spin on coating, and/or other suitable formation methods. The first bonding material 224a can also include a native oxide. In some embodiments, another bonding material can be formed on the semiconductor material 204 before transferring the seed portion $P_0$ to the first handle substrate 220a to form the first formation structure 222a. In some embodiments, a barrier material (not shown) can be incorporated into the first bonding material 224a or be provided separate from the first bonding material 224a. The barrier material can include materials that prevent diffusion of the first substrate material 226a. The barrier materials can include tantalum nitride (TaN), indium oxide ($In_2O_3$), copper silicide ($Cu_5Si$), tungsten nitride ($WN_2$), titanium nitride (TiN), silicon nitride ($Si_3N_4$), amorphous or polycrystalline silicon carbide (SiC), amorphous or polycrystalline silicon Si, and/or other suitable diffusion resistant materials. As shown in FIG. 2B, the first bonding material 224a can encapsulate the first substrate material 226a. In other embodiments, however, the first bonding material 224a does not encapsulate the first substrate material 226a or only partially encapsulates the first substrate material 226a.

Solid-solid bonding techniques can bond the semiconductor material 204 to a front-side surface 230 of the first handle substrate 220a. For example, the semiconductor material 204 and the donor substrate 202 may be mechanically pressed against the first handle substrate 220a while being heated to a bonding temperature (e.g., 300° C.). It is believed that the semiconductor material 204 and the first handle substrate 220a can bond with each other under such conditions via chemical bonding, van der Wals interactions, hydrogen bonds, and/or other suitable mechanisms. In some embodiments, another bonding material (not shown) can be formed on the semiconductor material 204 to facilitate bonding. In other embodiments, the semiconductor material 204 and the donor substrate 202 can be attached to the first handle substrate 220a using an adhesive material (not shown) and/or other suitable techniques.

One or more separation processes can separate the donor substrate 202 from the first handle substrate 220a and transfer the seed portion $P_0$ of the semiconductor material 204 to form the first formation structure 222a. The first formation structure 222a can extend to a first front-side thickness level 230a that corresponds to the amount of semiconductor material transferred in the separation process (es). Suitable separation processes can include exfoliating the seed portion $P_0$ of the semiconductor material 204 by implanting the semiconductor material 204 with an exfoliation agent (e.g., hydrogen, boron, etc.). The seed portion $P_0$ of the semiconductor material 204 can be separated from the donor substrate 202 by, e.g., heating the semiconductor material 204 to break the lattice where it was weakened by the implanted exfoliation agent. Also, in some embodiments, the first formation structure 222a may undergo further processing, such as polishing, planarization, annealing, and/or chemical treatment. For example, one or more polishing process can remove residual surface defects created by the implanted exfoliation agent.

Figure 2C:
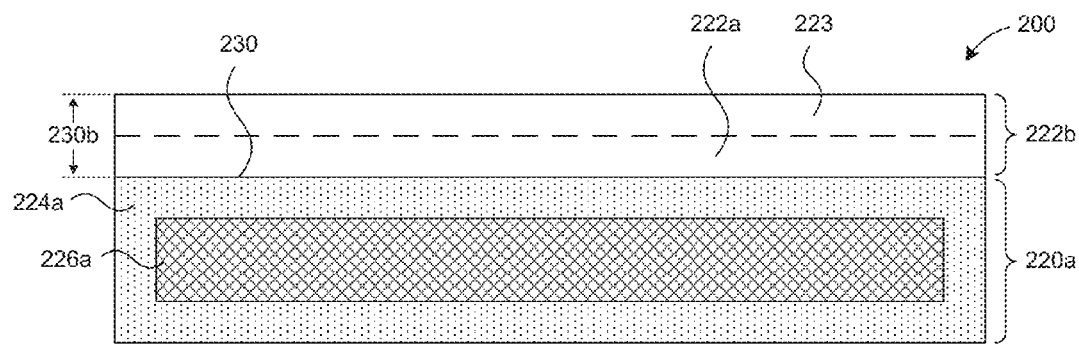

FIG. 2C shows the engineering substrate assembly 200 after a second formation structure 222b is formed on the first handle substrate 220a. The second formation structure 222b includes the first formation structure 222a and a semiconductor material 223 that is homoepitaxially grown on the first formation structure 222a to a second front-side thickness level 230b. For example, if the first formation structure 222a includes a GaN material, the semiconductor material 223 can be formed by homoepitaxial growth of the GaN material on the first formation structure 222a. The homoepitaxially grown semiconductor material 223 can be formed, for example, by MOCVD, PLD, ALD, or other suitable techniques.

In several embodiments, the second formation structure 222b has a CTE that is similar to or matched with the CTE of the first handle substrate 220a. Consequently, the second formation structure 222b is less prone to delamination or warping compared to conventional formation structures. For example, the second front-side thickness level 230b of the second formation structure 222b can be greater than the front-side thickness level 206a of the (heteroepitaxial) semiconductor material 204 of FIG. 2A. In some embodiments, the formation structure 222b can be formed on a large handle substrate (e.g., handle wafers having diameter of 150 mm, 200 mm, or 300 mm). For example, a 200 mm donor wafer can be used to form a thin first formation structure 222a on a 200 mm handle wafer. The first formation structure 222a may have a thickness of less than 10 nm to prevent delamination or wafer bowing. Once transferred, however, the second formation structure 222b can be expanded to the second front-side level thickness 230b without delamination or wafer bowing at the handle wafer.

In accordance with various embodiments of the present technology, the formation structure can be used to reduce manufacturing costs. In one embodiment, throughput can be increased by forming the formation structure on large diameter handle wafers that can process more devices at the same time compared to smaller diameter handle wafers. In another embodiment, the formation structure can reduce or consolidate the number of heteroepitaxial growth stages required in a manufacturing line. For example, conventional heteroepitaxial growth stages can have processing times of ten hours or more, which means that if the growth process fails, the substrate is damaged, or the device does not yield, these time consuming stages must be repeated. However, embodiments of the present technology can use the formation structure to seed formation templates on other substrates. In particular, after a formation structure is seeded and grown on a first handle substrate, the formation structure can seed formation templates on other substrates. Because the engineered substrate can support relatively larger formation structures than conventional donor substrates, the same formation structure can be used multiple times to seed multiple formation templates. For example, each bonding and transferring stage can be designed to remove a single slice of the formation structure, but leave a remaining portion of the formation structure suitable for further bonding and transferring. As a result, heteroepitaxy is not required to reproduce the formation template.

Figure 2D:

FIG. 2D shows the engineering substrate assembly 200 during a stage where the second formation structure 222b is attached to a front-side surface 231 of the second handle substrate 220b. The second handle substrate 220b includes a second substrate material 226b bonded to the second formation structure 222b through a second bonding material 224b. In some embodiments, the second handle substrate 220b is bonded to the second formation structure 222b in a manner similar to the bonding shown in FIG. 2B. In such embodiments, the second handle substrate 220b can include the same or similar bonding material and/or support substrate as those of the first handle substrate 220a. For example, the substrate assembly 200 can include a GaN formation structure 222b sandwiched between p-AlN-based handle substrates 220a and 220b. As such, the first and second handle substrates 220a and 220b can have CTEs that are the same or generally similar. In other embodiments, however, the second handle substrate 220b can include other materials and/or be attached to the second formation structure 222b differently.

Figure 2E:
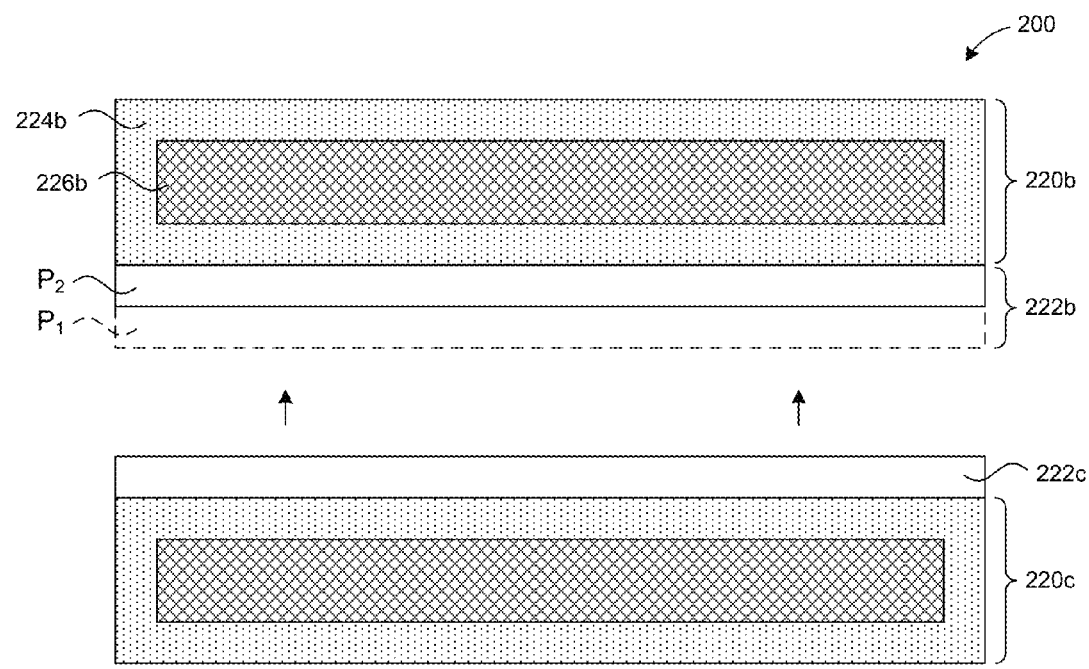

FIG. 2E shows the engineering substrate assembly 200 after forming a third formation structure 222c by separating a first portion ("$P_1$"; drawn in phantom) of the second formation structure 222b from the second handle substrate 220b. The transferring of the first portion $P_1$ of the second formation structure 222b can be similar to the transfer processes described above (e.g., via implantation and exfoliation). As illustrated in FIG. 2E, a second portion ("$P_2$"; drawn in solid) of the second formation structure 222b remains on the second handle substrate 220b. In one embodiment, the second portion $P_2$ of the second formation structure 222b can be bonded and transferred to another substrate (i.e., repeating the stages of FIGS. 2D and 2E with the second portion $P_2$ of the second formation structure 222b). In another embodiment, additional semiconductor material can be homoepitaxially formed on the second portion $P_2$ of the second formation structure 222b. The stages of FIGS. 2D and 2E could then be repeated to seed and form additional formation structures with this formation structure.

In some embodiments, and relative to the second formation structure 222b, the bonding and separation stages can relieve lattice stress and reduce dislocations and defects in the resultant third formation structure 222c. In particular, it is expected that the engineered substrate assembly 200 translates less defects to a transfer substrate than conventional donor substrates. Further, it is expected that homoepitaxially grown semiconductor materials have fewer defects than the base formation structure. Consequently, it is expected that additional transfer and bonding stages (not shown) can be used to further reduce dislocations and defects in a resultant formation structure.

Figure 2F:
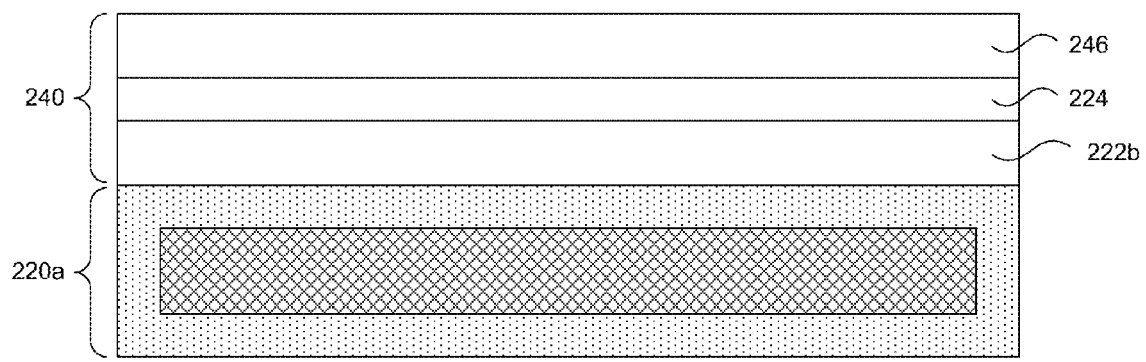

As shown in FIG. 2F, the process can further include forming an SST structure 240 on the engineered substrate assembly 200. The SST structure 240 can be configured to emit light in the visible spectrum (e.g., from about 390 nm to about 750 nm), in the infrared spectrum (e.g., from about 1050 nm to about 1550 nm), and/or in other suitable spectra.

In the illustrated embodiment, the SST structure 240 includes the second formation structure 222b of FIG. 2B as well as an active region 244 and a semiconductor material 246 formed sequentially on the second formation structure 222b. In other embodiments, the SST structure 240 can include other formation structures or portions of formation structures, such as the second portion $P_2$ of the second formation structure 222b or the third formation structure 222c of FIG. 2C. In one embodiment, the second formation structure 222b can include N-type GaN and the semiconductor material 246 can include P-type GaN. In selected embodiments, the second formation structure 222b and the semiconductor material 246 can individually include at least one of Gas, aluminum gallium arsenide (AlGas), gallium arsenide phosphide (GasP), gallium (III) phosphide (GaP), zinc selenide (ZnSe), boron nitride (BN), AlGaN, and/or other suitable semiconductor materials.

The active region 244 can include a single quantum well ("SQW"), MQWs, and/or a bulk semiconductor material. The term "bulk semiconductor material" generally refers to a single grain semiconductor material (e.g., InGaN) with a thickness between approximately 10 nanometers and approximately 500 nanometers. In certain embodiments, the active region 244 can include an InGaN SQW, GaN/InGaN MQWs, and/or an InGaN bulk material. In other embodiments, the active region 244 can include aluminum gallium indium phosphide (AlGaInP), aluminum gallium indium nitride (AlGaInN), and/or other suitable materials or configurations.

The SST structure 240 can be formed via metal organic chemical vapor deposition ("MOCVD"), molecular beam epitaxy ("MBE"), liquid phase epitaxy ("LPE"), hydride vapor phase epitaxy ("HVPE"), and/or other suitable epitaxial growth techniques. In other embodiments, the SST structure 240 can also include other suitable components, such as a buffer material that facilitates the formation of the third semiconductor material and 246 and the active region 244 on the second formation structure 222b. In further embodiments, the SST structure 240 can include additional bonding and seed layers to facilitate bonding and/or epitaxial growth.

Once formed, the SST structure 240 can be integrated into an SST device. For example, the method can further include forming other features of an SST device, such as forming a lens over the SST structure 240, a mirror on a back side of the SST structure 240, electrical contacts on or in the SST structure 240, and/or other suitable mechanical/electrical components (not shown). In some embodiments, the first substrate material 226a of the first handle substrate 220a can incorporate a reflective metal having a high melting point, such as Tungsten (W), (WN$_2$), or other suitable materials. During operation, the reflective material can reflect optical radiation that might otherwise be absorbed by or transmit through the first substrate material 226a. Alternatively, the SST structure 240 can be removed from the first handle substrate 220a. For example, the first handle substrate 220a can be removed by backgrinding, etching, polishing (e.g., CMP), and/or otherwise material removal process. In other embodiments, the handle substrate 220a or a portion thereof can remain attached to the SST structure 240 during subsequent manufacturing steps.

As discussed above, the donor substrate (e.g., the donor substrate 202) and/or heteroepitaxial semiconductor material(s) formed thereon can be substantially engineered to achieve a specific (i.e., custom tailored) formation structure at the handle substrate (e.g., lattice structure, crystal orientation, or exposed crystal face). In some instances, this might require considerable processing time, costly processing equipment, and/or expensive materials. For example, silicon donor wafers having non-standard crystal orientations are significantly more expensive than silicon donor wafers having conventional orientations (i.e., (1,1,1,), (1,1,0), or (1,0, 0)). In addition, intermediary materials, such as AlGaN, between the silicon and a III-nitride material are also expensive and time consuming to manufacture. Further, in certain instances, the transfer and bonding process between donor and handle substrates may require trial and error. However, in accordance with selected embodiments of the new technology, once a particular formation structure is achieved at the handle substrate, these expensive and time-intensive processes do not need to be repeated as frequently (or at all) to form additional formation structures on other substrates. That is, the formation structure can provide suitable formation templates at the other substrates rather than manufacturing a new (e.g., custom tailored) donor substrate for each additional formation structure.

Figure 3A:
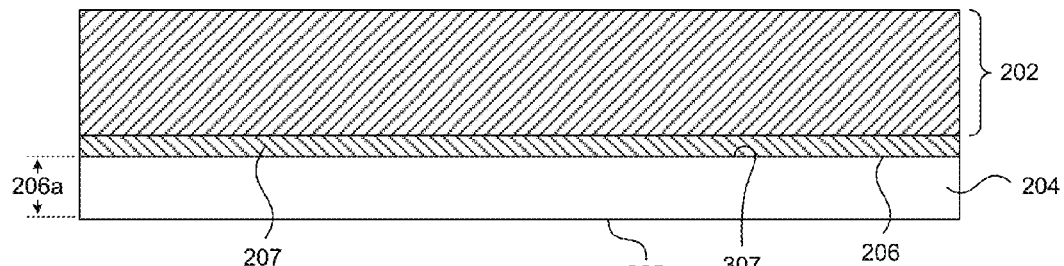
FIGS. 3A-3E are cross-sectional views illustrating another method of forming an engineered substrate assembly in accordance with the present technology.
Figure 3B:
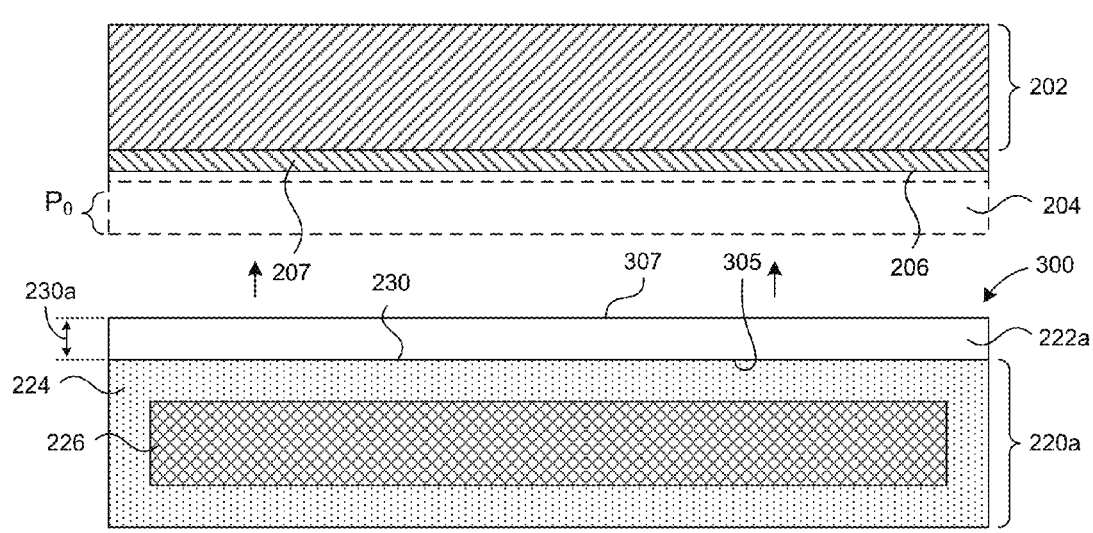
Figure 3C:
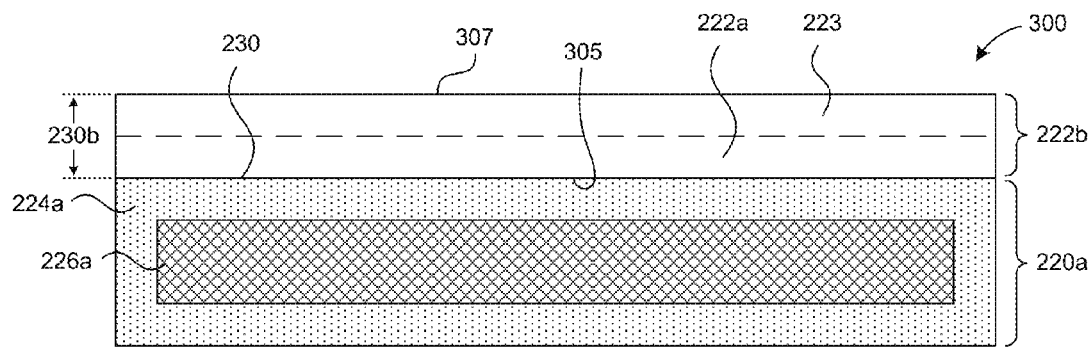
Figure 3D:
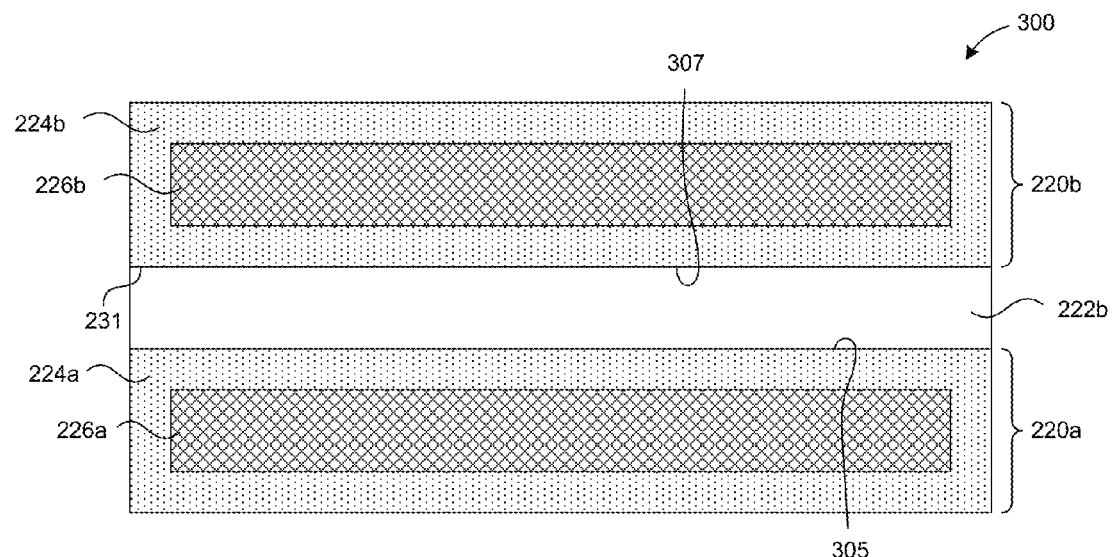
Figure 3E:
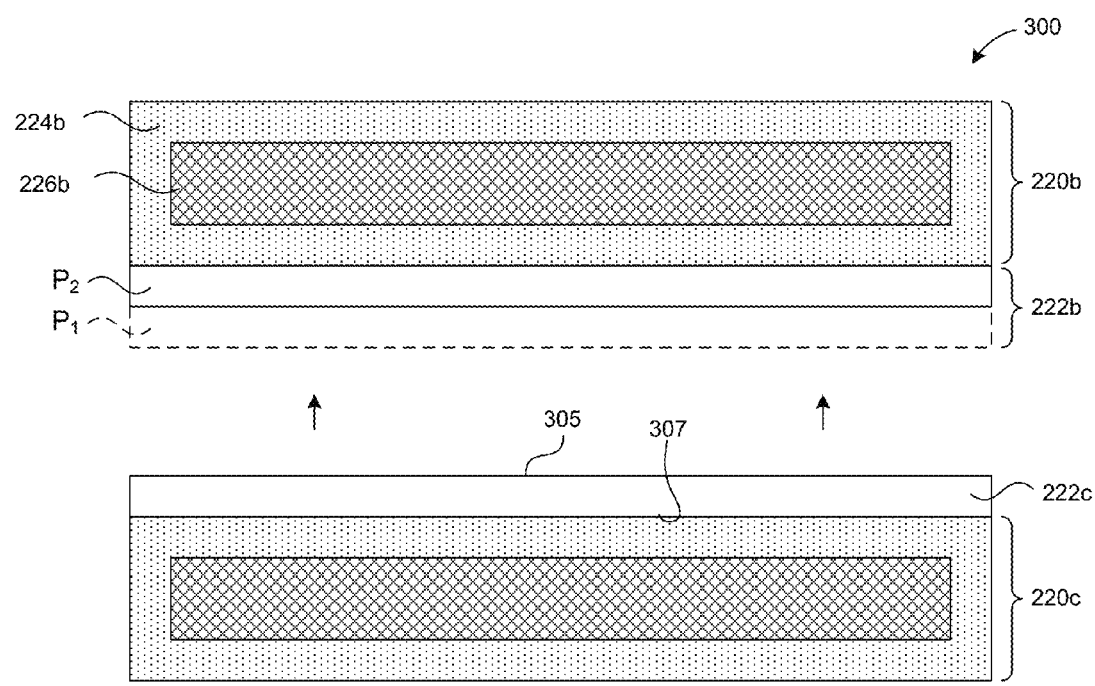

FIGS. 3A-3E show cross-sectional views illustrating a method of forming an engineering substrate assembly having an engineered GaN formation structure with an exposed N-face surface (FIG. 3D) or an exposed Ga-face surface (FIG. 3E). As described below with reference to FIGS. 4A-4D, it is believed that an LED device with N-face/active region interface can operate at an efficiency that is six to ten percent more efficient than a device with a Ga-face/active region interface.

FIG. 3A shows the donor substrate 202 and the semiconductor material 204 during a manufacturing stage that is similar to the manufacturing stage of FIG. 2A. The semiconductor material 204 includes GaN having an exposed Ga-face 305 and a buried N-face 307. In other embodiments, the donor substrate 202 and the semiconductor material 204 can be engineered to provided GaN with an exposed N-face and a buried Ga-face (not shown).

FIGS. 3B-3E shows the engineering assembly 200 during manufacturing stages that are similar to the manufacturing stages of FIG. 2B-2E, respectively. As shown in FIG. 3B, after bonding the donor substrate 202 and the first handle substrate 220a, the Ga-face 305 of the first formation structure 222a faces towards the first handle substrate 220a and the N-face 307 of the second formation structure 222b faces away from the first handle substrate 220a. When the donor substrate 202 is separated, as shown in FIG. 3C, the N-face 307 of the first formation structure 222a is exposed and the Ga-face 305 is buried. Processing can continue to form the second formation structure 222b, as shown in FIG. 3D. In some embodiments, processing can continue to a stage similar to the stage shown in FIG. 3E. This results in the third formation structure 222c having the N-face 307 buried and the Ga-face 305 again exposed. In either case, the resultant formation structure can be incorporated into an SST structure (such as shown in FIG. 2F) or other suitable semiconductor device.

FIGS. 4A-4D are diagrams showing simulation results of an N-face GaN-based LED device (i.e., an LED having an N-face interface with the active region) compared to a Ga-face GaN-based LED (i.e., an LED having a Ga-face interface with the active region). The simulation results are based on a self-consistent solution to the Poisson equation, continuity equations for electrons and holes, and the Schrodinger equation. Each of the N-face and G-face devices are simulated to have a single quantum well (SQW) structure with a formation structure having a 200 nm N-type GaN material doped at $5 \times 10^{18}$ cm$^{-3}$, an active region having a 12 nm GaN barrier and a 2 nm Ga$_{0.8}$In$_{0.2}$N quantum well, and a semiconductor material on the active region having a 12 nm GaN barrier and 200 nm P-type GaN material doped at $7 \times 10^{19}$ cm$^{-3}$.

Figure 4A:
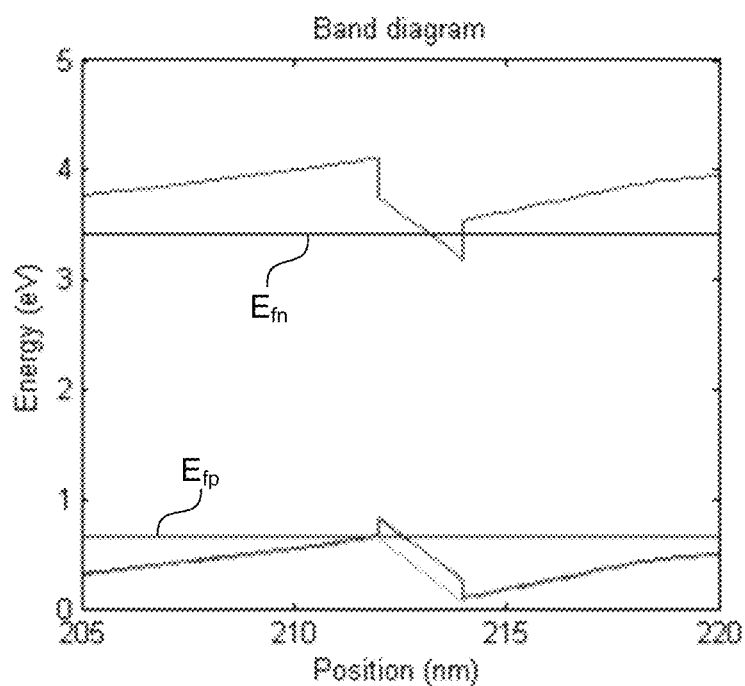
FIGS. 4A-4D are schematic diagrams illustrating simulation results of an LED device in accordance with the present technology.
Figure 4B:
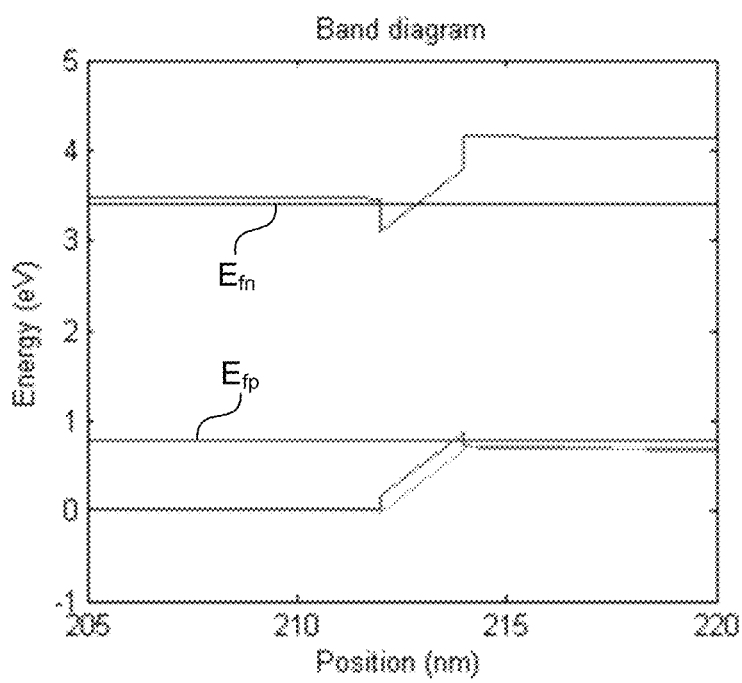
Figure 4C:
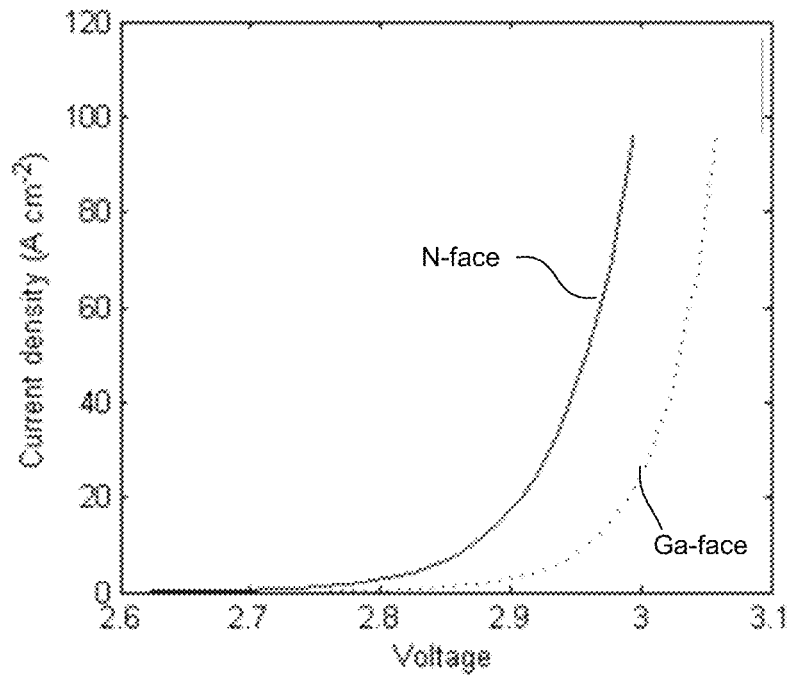
Figure 4D:
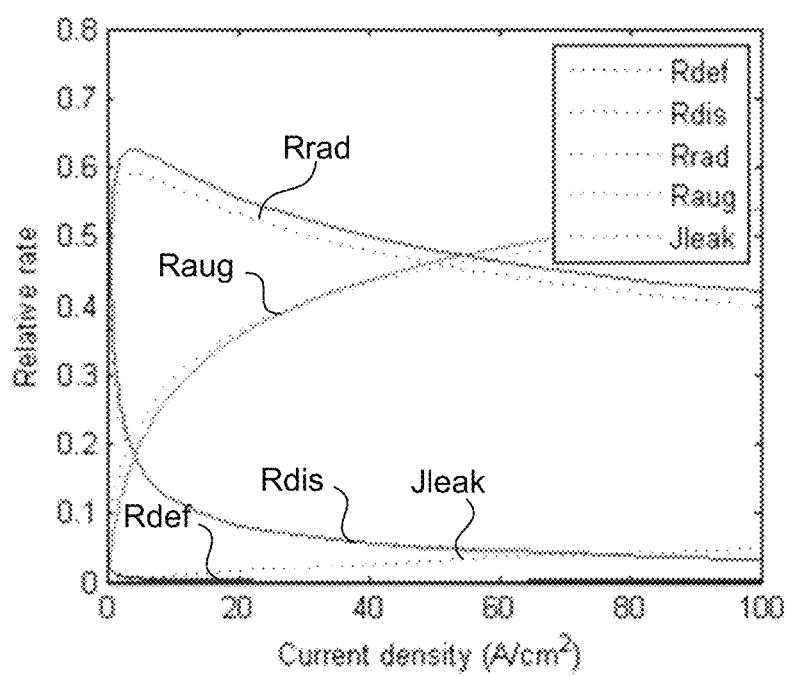

Referring to FIGS. 4A and 4B together, the N-face and Ga-face devices are simulated to have a current density of 0.1 A cm$^{-2}$. Comparing the band gap profiles of the simulated devices, the N-face device (FIG. 4A) is predicted to provide higher emission efficiency than the Ga-face device (FIG. 4B). As shown in FIG. 4C, the N-face device is also predicted to have a lower forward voltage than the Ga-face device under the same operating conditions. The various carrier loss rates of the N-face and Ga-face devices are shown in FIG. 4D. Relative rates of defect assisted recombination (Rdef), dislocation assisted recombination (Rdis), radiative recombination (Rrad), recombination (Raug), and carrier loss by leakage (Jleak) are shown in solid curves for the N-face device and in dashed curves for the Ga-face device. Overall, the N-face device is expected to have a 3-5% efficacy gain based on reduced forward voltage (as shown in FIG. 4C) and a 3-5% efficacy gain based on improved radiative recombination rate (as shown in FIG. 4D). Thus, the total efficacy gain of the N-face device could be expected to be in the range of 6-10%.

Figure 5:
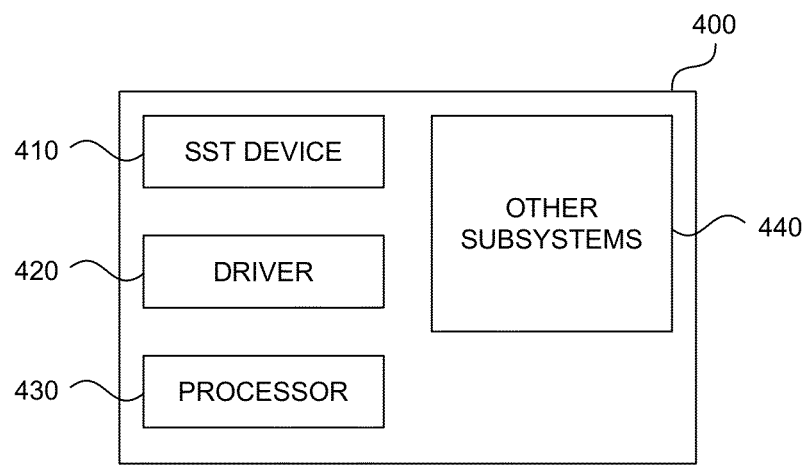
FIG. 5 is a schematic view of an SST system including devices made using an engineered substrate assembly in accordance with the present technology.

The engineered substrate assembly 200 described above with reference to FIGS. 2A-4D can be used to form SST structures and/or other semiconductor structures that are incorporated into any of a myriad of larger and/or more complex devices or systems, a representative example of which is system 400 shown schematically in FIG. 5. The system 400 can include one or more SST devices 410, a driver 420, a processor 430, and/or other subsystems or components 440. The resulting system 400 can perform any of a wide variety of functions, such as backlighting, general illumination, power generations, sensors, and/or other suitable functions. Accordingly, representative systems 400 can include, without limitation, hand-held devices (e.g., mobile phones, tablets, digital readers, and digital audio players), lasers, photovoltaic cells, remote controls, computers, and appliances. Components of the system 400 may be housed in a single unit or distributed over multiple, interconnected units (e.g., through a communications network). The components of the system 400 can also include local and/or remote memory storage devices, and any of a wide variety of computer readable media.

From the foregoing, it will be appreciated that specific embodiments of the technology have been described herein for purposes of illustration, but that various modifications may be made without deviating from the disclosure. Certain aspects of the present technology described in the context of particular embodiments may also be combined or eliminated in other embodiments. Additionally, while advantages associated with certain embodiments of the present technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. An engineered substrate assembly, comprising:
   a handle substrate including a first substrate material that includes poly-aluminum nitride (p-AlN), wherein the handle substrate includes a bonding material encapsulating the first substrate material, wherein the bonding material does not include III-V materials; and
   a solid state structure including an active region disposed between a first semiconductor layer and a second semiconductor layer, wherein the first semiconductor layer is disposed between the active region and the bonding material encapsulating the first substrate material, and wherein the first semiconductor layer comprises gallium nitride (GaN) having a Ga-face that directly interfaces with the bonding material and an N-face that directly interfaces with the active region.

2. The engineered substrate assembly of claim 1 wherein the first semiconductor layer has a first coefficient of thermal expansion (CTE) that is substantially similar to a second CTE of the p-AlN.

3. The engineered substrate assembly of claim 1 wherein the first semiconductor layer includes N-type gallium nitride (GaN), and wherein the second semiconductor layer includes P-type GaN.

4. A light emitting diode (LED) device, comprising:
   an engineered substrate assembly including:
   a substrate material;
   an epitaxial formation template comprising gallium nitride (GaN);
   a bonding material encapsulating the substrate material, wherein the bonding material does not include III V materials; and
   an LED active region operatively coupled with the epitaxial formation template, wherein the epitaxial formation template has a Ga-face that directly interfaces with the bonding material and an N-face that directly interfaces with the LED active region.

5. The LED device of claim 4 wherein the substrate material comprises poly-aluminum nitride (p-AlN).

6. The LED device of claim 4 wherein:
   the LED active region comprises at least one of a bulk indium gallium nitride (InGaN), an InGaN single quantum well, or GaN/InGaN multiple quantum wells, and wherein the LED device further comprises a semiconductor material on the LED active region that comprises P-type GaN.

7. The engineered substrate assembly of claim 1 further comprising a barrier layer disposed between the first substrate material and the first semiconductor layer, the barrier layer preventing diffusion of the first substrate material.

8. The engineered substrate assembly of claim 7 wherein the barrier layer is disposed between the first substrate material and the bonding material.

9. The engineered substrate assembly of claim 1 wherein the bonding material comprises an oxide or a nitride.

10. The LED device of claim 4 wherein the bonding material comprises an oxide or a nitride.

* * * * *